United States Patent
Nishizono

(10) Patent No.: US 9,141,499 B2
(45) Date of Patent: Sep. 22, 2015

(54) SEMICONDUCTOR INSPECTION APPARATUS AND SEMICONDUCTOR INSPECTION METHOD

(71) Applicant: KABUSHIKI KAISHA TOSHIBA, Minato-ku (JP)

(72) Inventor: Masami Nishizono, Tatsuno (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 96 days.

(21) Appl. No.: 14/020,203

(22) Filed: Sep. 6, 2013

(65) Prior Publication Data

US 2014/0157069 A1 Jun. 5, 2014

(30) Foreign Application Priority Data

Dec. 4, 2012 (JP) ................................. 2012-265063

(51) Int. Cl.
| | | |
|---|---|---|
| G06F 11/00 | (2006.01) | |
| H03M 13/00 | (2006.01) | |
| G06F 11/22 | (2006.01) | |
| G01R 31/319 | (2006.01) | |
| G01R 31/28 | (2006.01) | |

(52) U.S. Cl.
CPC ...... *G06F 11/2273* (2013.01); *G01R 31/31908* (2013.01); *G01R 31/2894* (2013.01)

(58) Field of Classification Search
CPC ..................... G01R 31/31701; G01R 11/2273; G01R 31/31908; G01R 29/00; G01R 29/26; H04L 1/20
See application file for complete search history.

(56) References Cited

U.S. PATENT DOCUMENTS

| | | | | |
|---|---|---|---|---|
| 5,530,373 A  * | 6/1996 | Gibson et al. ............ 324/754.07 |
| 6,895,548 B2 | 5/2005 | Kitada et al. |
| 2002/0100000 A1* | 7/2002 | Kitada et al. .................. 714/815 |
| 2005/0138504 A1* | 6/2005 | Kanbayashi .................. 714/724 |
| 2006/0028648 A1* | 2/2006 | Yao et al. ...................... 356/446 |
| 2011/0002472 A1* | 1/2011 | Quan .............................. 381/58 |

FOREIGN PATENT DOCUMENTS

| | | |
|---|---|---|
| JP | 2003-057320 A | 2/2003 |
| JP | 2010-038746 A | 2/2010 |

\* cited by examiner

*Primary Examiner* — Guerrier Merant
(74) *Attorney, Agent, or Firm* — White & Case LLP

(57) ABSTRACT

A semiconductor inspection apparatus has a test-program execution part, a signal-condition detection part, a test-time calculation part to calculate an optimum test time having a duration from a period of the unstable region to a certain period at a leading portion of the stable region subsequent to the unstable region based on the unstable and stable regions detected by the signal-condition detection part, a test-program modification part to reflect the optimum test time in the test program, and a signal waveform importing part to import a signal at the signal output pin of the device to be tested based on a test time written in the test program in which the optimum test time is reflected. The test-program execution part executes the test program again after the optimum test time is reflected in the test program by the test-program modification part.

8 Claims, 5 Drawing Sheets

FIG. 6

SEMICONDUCTOR INSPECTION APPARATUS AND SEMICONDUCTOR INSPECTION METHOD

CROSS REFERENCE TO RELATED APPLICATIONS

This application is based upon and claims the benefit of priority from the prior Japanese Patent Application No. 2012-265063, filed on Dec. 4, 2012, the entire contents of which are incorporated herein by reference.

FIELD

An embodiment of the present invention relates to a semiconductor inspection apparatus and a semiconductor inspection method for inspecting devices to be tested in accordance with a test program.

BACKGROUND

When inspecting a semiconductor chip using a test program, it is important to perform inspection in a short time as much as possible. From when a test signal is input to a test-signal input pin of a semiconductor chip, it takes a certain period of time until a signal at a signal output pin starts to vary. Moreover, the signal at the signal output pin does not suddenly reach a desired signal level. There is an unstable region in which the signal level is unstable for a while after the signal starts to vary and then moves to a stable region.

For the reason above, conventionally, a test signal is applied to a test-signal input pin of a semiconductor chip to measure a waveform at a signal output pin using measuring equipment such as an oscilloscope. The measured waveform is then analyzed to detect unstable and stable regions, and based on a result of detection, a signal read-in timing is set. This operation has to be done by an operator manually, hence it takes time to perform this operation. Moreover, since this operation has to be performed for each signal output pin, there is a problem in that an operator's burden is increased as the number of pins is increased.

BRIEF DESCRIPTION OF THE DRAWINGS

FIG. 6 is a view showing an example of a test program.

DETAILED DESCRIPTION

According to one embodiment, a semiconductor inspection apparatus has a test-program execution part configured to execute a test program by applying a specific signal to a test-signal input pin of a device to be tested in accordance with the test program, a signal-condition detection part configured to detect an unstable region and a stable region of a signal at a signal output pin of the device to be tested while the test program is executed, a test-time calculation part configured to calculate an optimum test time having a duration from a period of the unstable region to a certain period at a leading portion of the stable region subsequent to the unstable region based on the unstable and stable regions detected by the signal-condition detection part, a test-program modification part configured to reflect the optimum test time in the test program, and a signal waveform importing part configured to import a signal at the signal output pin of the device to be tested based on a test time written in the test program in which the optimum test time is reflected. The test-program execution part executes the test program again after the optimum test time is reflected in the test program by the test-program modification part.

An embodiment will now be explained with reference to the accompanying drawings.

Figure 1:
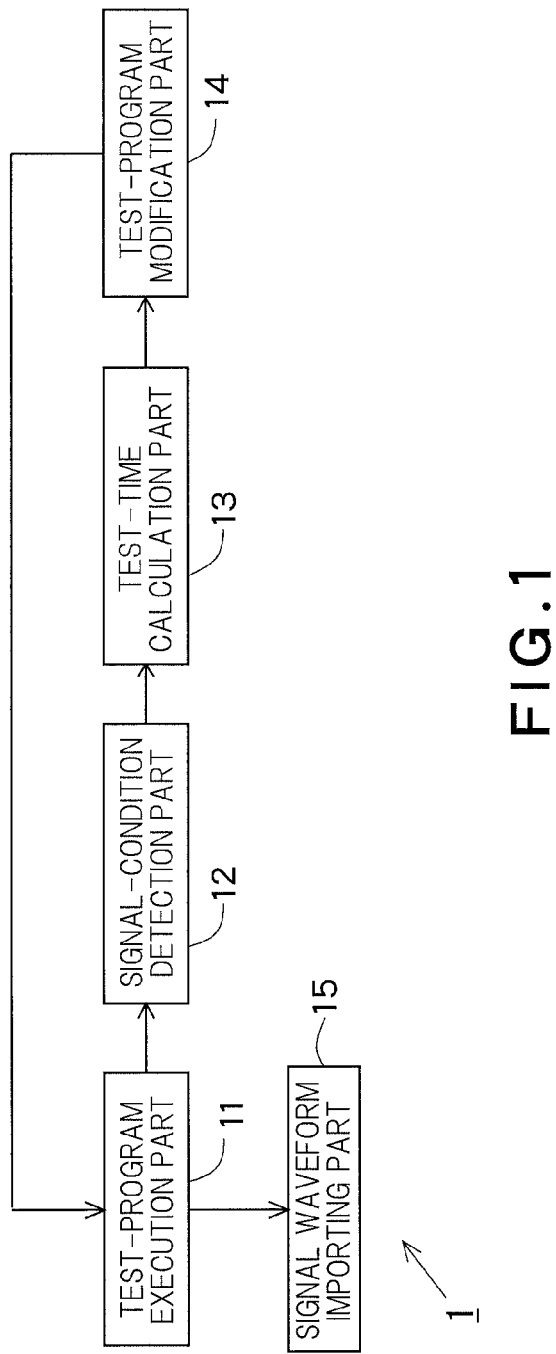
FIG. 1 is a block diagram showing the configuration of the main section of a semiconductor inspection apparatus 1 according to an embodiment.
Figure 2:
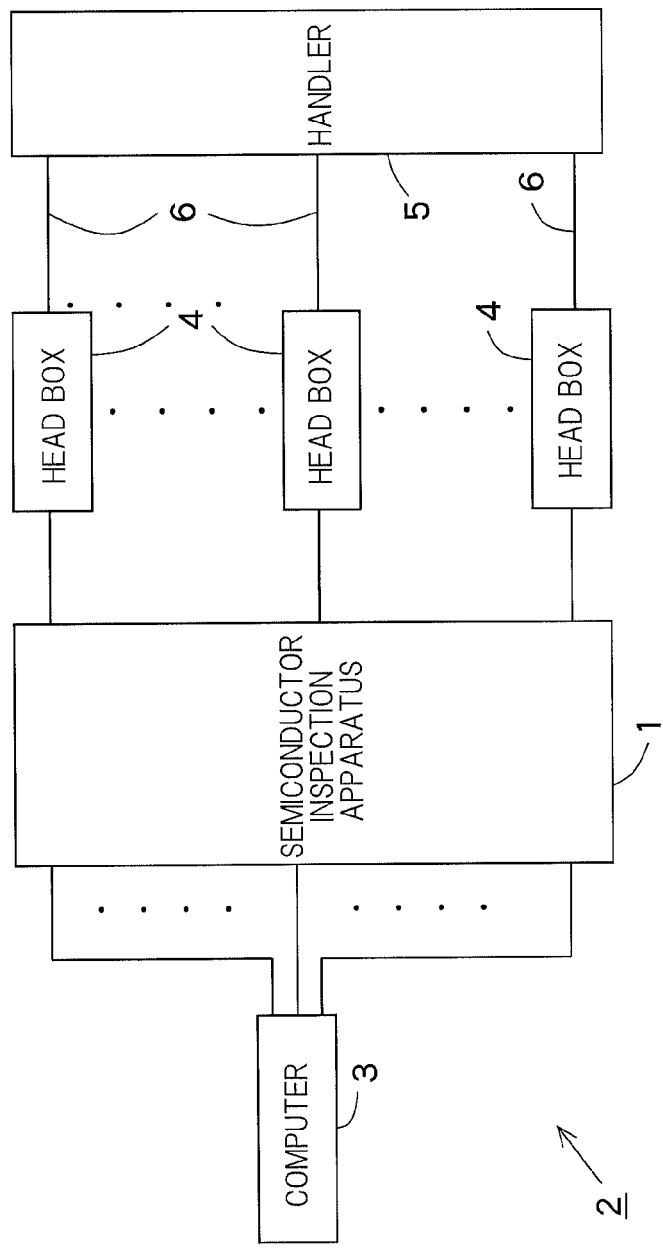
FIG. 2 is a view schematically showing the configuration of an inspection system 2 including the semiconductor inspection apparatus 1 of FIG. 1.

FIG. 1 is a block diagram showing the configuration of the main part of a semiconductor inspection apparatus 1 according to an embodiment. FIG. 2 is a view schematically showing the configuration of a semiconductor inspection system 2 including the semiconductor inspection apparatus 1 of FIG. 1.

The semiconductor inspection apparatus 1 of FIG. 1 inspects several kinds of electrical characteristics of a device to be tested.

There is no particular limitation to the electrical characteristics to be inspected. For example, the electrical characteristics to be inspected are DC characteristics such as a signal amplitude and a signal delay time. There is also no particular limitation to the type of device to be tested. For example, the devices to be tested are discrete semiconductor devices such as diodes, bipolar transistors and MOS transistors, and also system LSIs, memories, etc.

Firstly, an outline of the semiconductor inspection system 2 of FIG. 2 will be explained. The semiconductor inspection system 2 of FIG. 2 is provided with a semiconductor inspection apparatus 1 having the same configuration as FIG. 1, a computer 3, head boxes 4, and a handler 5.

The computer 3 may be a general-purpose PC, a workstation, a minicomputer, etc. The computer 3 and the semiconductor inspection apparatus 1 are connected to each other by a plurality of cables. Each cable is used for transmitting inspection results, a test program, etc. Each cable may be a serial cable for serial transfer or a parallel cable for parallel transfer. There is also no particular limitation to the number of cables.

For example, a plurality of head boxes 4 are connected to the semiconductor inspection apparatus 1. A test cable 6 that is connected to a device to be tested is connected to each head box 4. Test cables 6 are connected to different test pins of a device to be tested. The head boxes 4 can perform measurements in parallel, so that they can perform signal waveform measurements simultaneously at a plurality of test pins of one device to be tested. Moreover, the test cables 6 of the head boxes 4 can be connected to different devices to be tested to perform signal waveform measurements simultaneously at respective specific test pins of the different devices to be tested.

The handler 5 performs a process of transferring a device to be tested. A socket (not shown) on which a device to be tested is mounted is provided at the tip of each of the test cables 6 connected to the head boxes 4. The handler 5 performs a process of transferring a device to be tested among sockets.

Next, the semiconductor inspection apparatus 1 of FIG. 1 will be explained. The semiconductor inspection apparatus 1 of FIG. 1 is provided with a test-program execution part 11, a signal-condition detection part 12, a test-time calculation part 13, a test-program modification part 14, and a signal waveform importing part 15.

The test-program execution part 11 applies specific signals to test-signal input pins of a device to be tested in accordance with a test program to execute the test program. The test program may be generated by the semiconductor inspection apparatus 1 or the computer 3.

While the test program is running, the signal-condition detection part 12 detects an unstable region and a stable region of a signal at a signal output pin of a device to be tested. For example, a signal at a signal output pin is converted into a digital signal by an A/D converter (not shown) and the change in signal level of the digital signal is monitored to detect an unstable region in which the signal level is unstable and a stable region in which the signal level becomes stable after the unstable region. Or signal waveform measuring equipment such as an oscilloscope may be installed in the semiconductor inspection apparatus 1 to monitor a signal at a signal output pin to detect the unstable and stable regions described above.

Based on the unstable and stable regions detected by the signal-condition detection part 12, the test-time calculation part 13 calculates an optimum test time having a duration from a period of an unstable region to a certain period at the leading portion of the following stable region. For example, the optimum test time has a duration minimum required for correctly importing a signal at a signal output pin. When a device to be tested has a plurality of signal output pins, the test-time calculation part 13 calculates an optimum test time for each pin.

The test-program modification part 14 reflects an optimum test time in a test program.

In this modification, the test-program modification part 14 performs a process of replacing a test time value written in a test program with an optimum test time.

Based on a test time written in the test program after the reflection of the optimum test time, the signal waveform importing part 15 imports a signal at a signal output pin of a device to be tested. In more specifically, just before the end of the test time, the signal waveform importing part 15 imports a signal at the corresponding signal output pin. When different test times are written in the test program for a plurality of signal output pins, the signal waveform importing part 15 imports a signal at each signal output pin based on the corresponding test time.

Figure 3:
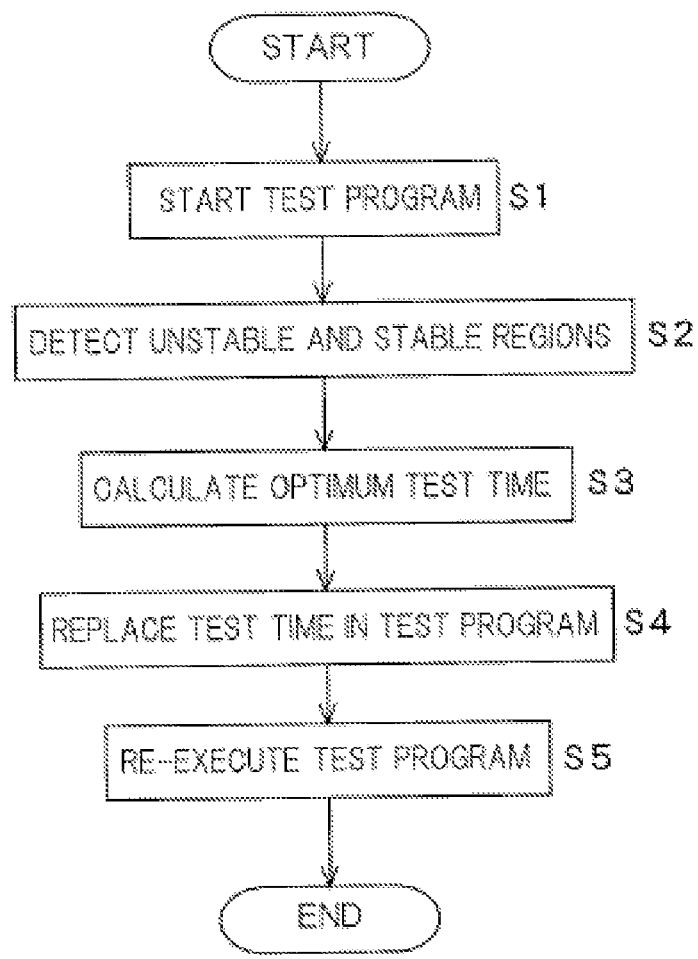
FIG. 3 is a flowchart showing an example of an operation of the semiconductor inspection apparatus 1 of FIG. 1.

FIG. 3 is a flowchart showing an example of an operation of the semiconductor inspection apparatus 1 of FIG. 1. The semiconductor inspection apparatus 1 of FIG. 1 starts a process of FIG. 3 when a device to be tested is conveyed by the handler 5 and a test cable 6 of a head box 4 is connected to a test-signal input pin of the device to be tested.

Firstly, the test-program execution part 11 starts a test program (step S1). When the test program starts, a specific signal is input to a device to be tested from a test-signal input pin thereof.

Thereafter, the signal-condition detection part 12 monitors a signal at a signal output pin to detect an unstable region in which a signal level starts to vary, without becoming stable and the following stable region (step S2).

Then, based on the unstable and stable regions detected in step S2, the test-time calculation part 13 calculates an optimum test time (step S3).

Next, the test-program modification part 14 replaces a test time originally written in the test program with the optimum test time calculated in step S3 (step S4).

Thereafter, the test-program execution part 11 executes the test program again to make the signal waveform importing part 15 import a signal at the signal output pin at a moment just before the end of the test time written in the test program, that is after the transition from the unstable region to the stable region, in accordance with the test program (step S5). The signal read into the signal waveform importing part 15 is sent to the computer 3 according to need.

After the test program is executed again in step S5, steps S2 to S4 may be repeated. With the repetition, unstable and stable regions are detected whenever the test program is executed, hence it is possible to set the optimum test time to a value of higher accuracy.

Figure 4:
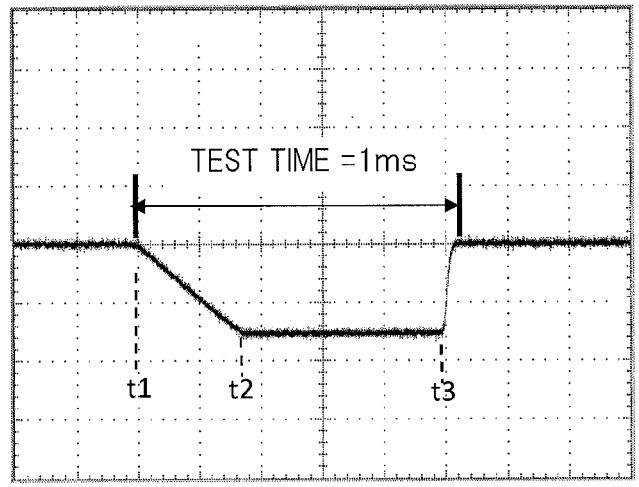
FIG. 4 is a view of a signal waveform that is an example of a signal at a signal output pin.

FIG. 4 is a view of a signal waveform that is an example of a signal at a signal output pin. FIG. 4 shows an example of an unstable region starting at a time t1 and a stable region from a time t2 to a time t3. When the signal of FIG. 4 is imported after a specific signal is applied to a test-signal input pin of a device to be tested in accordance with a test program, an accurate signal level cannot be measured if the signal is not imported within a stable region. Conventionally, as shown in FIG. 4, a relatively long test time is set so that it extends over from an unstable region to a stable region and a signal is imported just before the completion of the test time. By contrast, it is a primary concern in this embodiment to set the test time to as small a value as possible.

Moreover, conventionally, a signal waveform at a signal output pin is measured by a manual operation using signal waveform measuring equipment such as an oscilloscope, to detect unstable and stable regions, and a test time is also set by a manual operation. By contrast, in this embodiment, the signal-condition detection part 12 automatically detects unstable and stable regions, and an optimum test time is also automatically set. In this way, even if there are many signal output pins, it is possible to quickly set an optimum test time for each signal output pin.

Figure 5:
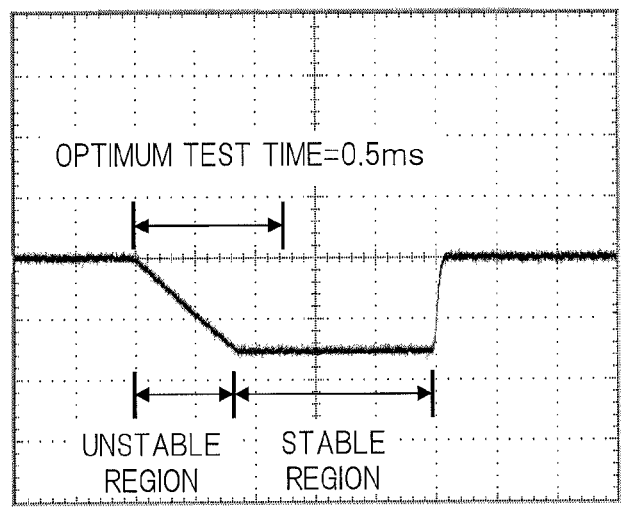
FIG. 5 is a view showing an example of an optimum test time calculated by a test-time calculation part 13.

FIG. 5 is a view showing an example of an optimum test time calculated by the test-time calculation part 13. The test-time calculation part 13 sets an optimum test time through the period from an unstable region to a stable region. However, this setting is performed so that the stable region has as short a period as possible in the optimum test time. It is therefore possible to shorten the period of the optimum test time to a necessary minimum.

Figure 6:
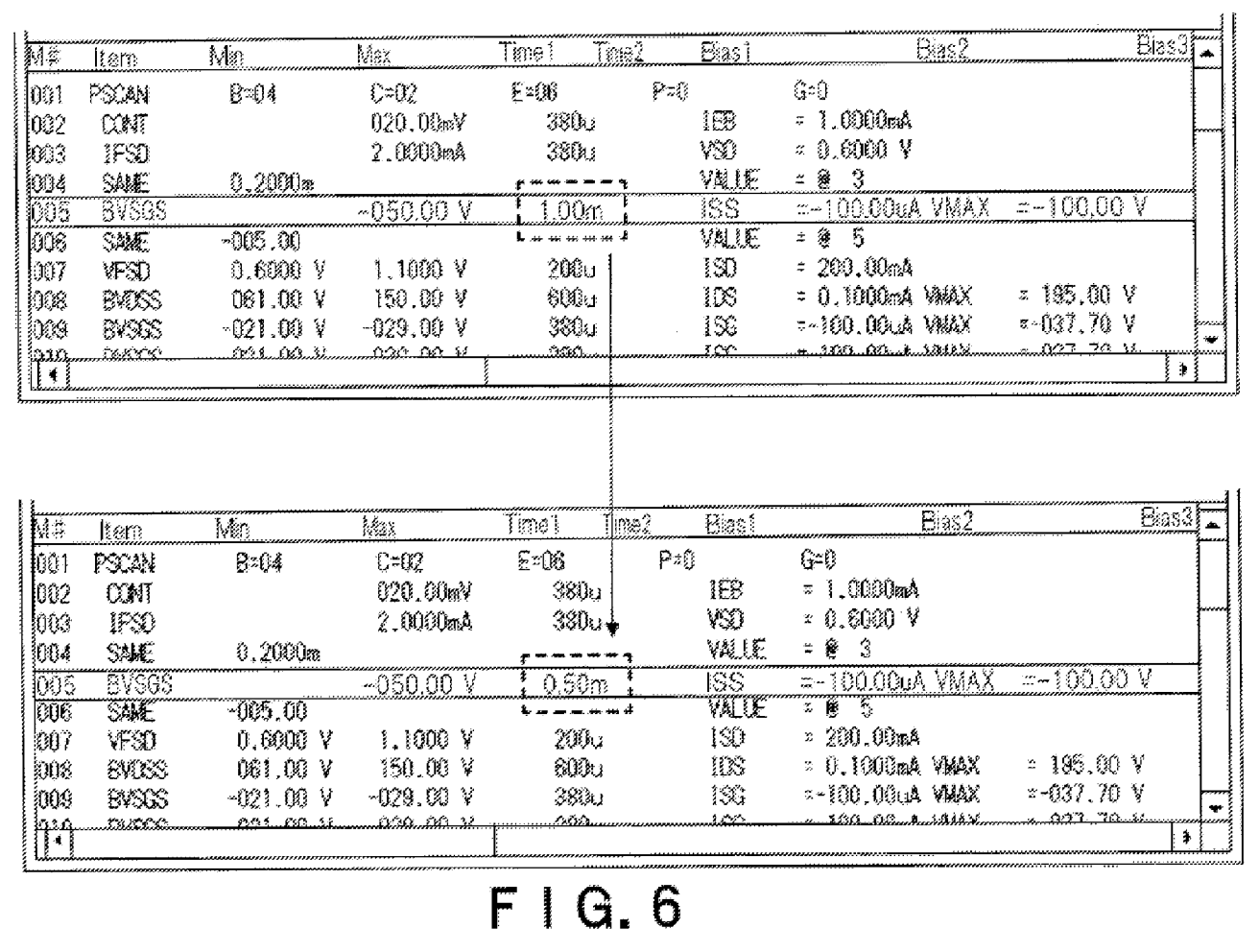

FIG. 6 is a view showing an example of a test program. The test-program modification part 14 replaces a test time that has already been written in a test program with an optimum test time calculated by the test-time calculation part 13. FIG. 6 shows an example in which a test time of 1.00 ms already written is replaced with an optimum test time of 0.50 ms.

FIG. 6 shows an example of a test program in which one test time is written. However, if a plurality of test times are written, each test time is replaced with an optimum test time.

As described above, in this embodiment, an optimum test time having a duration from a period of an unstable region to a certain period at the leading portion of the following stable region is calculated for a signal at a signal output pin of a device to be tested and reflected in a test program. Therefore, a signal can be imported with an optimum test time of necessary minimum for each signal output pin of a device to be tested, and hence an inspection time can be drastically shortened.

Moreover, in this embodiment, a process of calculating an optimum test time can be performed automatically. Therefore, it is not needed to detect unstable and stable regions by a manual operation using signal waveform measuring equipment such as an oscilloscope, hence the operator's burden can be reduced.

At least part of the semiconductor inspection apparatus 1 explained in the embodiment described above can be configured with hardware or software. When configuring with software, a program that realizes the function of at least part of the semiconductor inspection apparatus 1 may be stored in a storage medium such as a flexible disk and CD-ROM, and installed in a computer to be executed. Not being limited to a detachable type such as a magnetic disk and an optical disk, the storage medium may be a stationary type such as a hard disk and a memory.

Moreover, a program that realizes the function of at least part of the semiconductor inspection apparatus 1 may be distributed via a communication network (including wireless communication) such as the Internet. The program may also be distributed via an online network such as the Internet or a wireless network, or stored in a storage medium and distributed under the condition that the program is encrypted, modulated or compressed.

While certain embodiments have been described, the embodiment has been presented by way of example only, and is not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor inspection apparatus comprising:
a test-program execution part configured to execute a test program by applying a specific signal to a test-signal input pin of a device to be tested in accordance with the test program;
a signal-condition detection part configured to detect an unstable region and a stable region of a signal at a signal output pin of the device to be tested while the test program is executed;
a test-time calculation part configured to calculate an optimum test time having a duration from a period of the unstable region to a certain period at a leading portion of the stable region subsequent to the unstable region based on the unstable and stable regions detected by the signal-condition detection part;
a test-program modification part configured to replace a test time in the test program; and
a signal waveform importing part configured to import a signal at the signal output pin of the device to be tested based on the test time written in the test program in which the test time is replaced,
wherein the test-program execution part executes the test program again after the test time is replaced in the test program by the test-program modification part.

2. The semiconductor inspection apparatus of claim 1, wherein the optimum test time has a duration minimum required for correctly importing a signal at the signal output pin.

3. The semiconductor inspection apparatus of claim 1, wherein the test-program modification part replaces a test time written in the test program with the optimum test time.

4. The semiconductor inspection apparatus of claim 1, wherein, just before an end of the test time written in the test program, the signal waveform importing part imports a signal at the corresponding signal output pin.

5. The semiconductor inspection apparatus of claim 4, wherein the signal waveform importing part imports the signal at the corresponding signal output pin after the signal has shifted from the unstable region to the stable region.

6. The semiconductor inspection apparatus of claim 1, wherein, when there are a plurality of signal output pins, the test-time calculation part calculates an optimum test time for each signal output pin.

7. The semiconductor inspection apparatus of claim 1, wherein the unstable region is a region in which a signal level of a signal at the corresponding signal output pin starts to vary and is still unstable, and the stable region is a region subsequent to the unstable region, in which the signal level is stable.

8. The semiconductor inspection apparatus of claim 1, wherein the signal-condition detection part detects the unstable and stable regions whenever the test-program execution part executes the test program.

* * * * *